(12) United States Patent
Kitai et al.

(10) Patent No.: US 11,351,755 B2
(45) Date of Patent: Jun. 7, 2022

(54) METAL-CLAD LAMINATE, PRINTED WIRING BOARD AND METAL FOIL WITH RESIN

(71) Applicant: Panasonic Intellectual Property Management Co., Ltd., Osaka (JP)

(72) Inventors: Yuki Kitai, Osaka (JP); Hiroaki Fujiwara, Nara (JP); Mikio Sato, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 643 days.

(21) Appl. No.: 16/332,138

(22) PCT Filed: Sep. 12, 2017

(86) PCT No.: PCT/JP2017/032760
§ 371 (c)(1),
(2) Date: Mar. 11, 2019

(87) PCT Pub. No.: WO2018/061736
PCT Pub. Date: Apr. 5, 2018

(65) Prior Publication Data
US 2019/0217576 A1    Jul. 18, 2019

(30) Foreign Application Priority Data

Sep. 27, 2016   (JP) .............................. JP2016-188058

(51) Int. Cl.
*B32B 15/04* (2006.01)
*B32B 15/08* (2006.01)
(Continued)

(52) U.S. Cl.
CPC .............. *B32B 15/04* (2013.01); *B32B 15/08* (2013.01); *B32B 27/00* (2013.01); *B32B 27/08* (2013.01);
(Continued)

(58) Field of Classification Search
None
See application file for complete search history.

(56) References Cited

U.S. PATENT DOCUMENTS

| | | |
|---|---|---|
| 6,306,963 B1 * | 10/2001 | Lane ................... C08F 290/061 525/242 |
| 2004/0146692 A1 * | 7/2004 | Inoue ..................... B32B 15/14 428/141 |

(Continued)

FOREIGN PATENT DOCUMENTS

| | | |
|---|---|---|
| CN | 104254571 A | 12/2014 |
| JP | 2003-017820 | 1/2003 |

(Continued)

OTHER PUBLICATIONS

Kumta and Kim—Low dielectric constant glasses—Handbook of low dielectric materials—1999 (Year: 1999).*

(Continued)

*Primary Examiner* — Callie E Shosho
*Assistant Examiner* — John Vincent Lawler
(74) *Attorney, Agent, or Firm* — Greenblum & Bernstein, P.L.C.

(57) ABSTRACT

A metal-clad laminate includes an insulating layer including a cured product of a resin composition, and a metal foil disposed on at least one principal surface of the insulating layer. The resin composition includes a thermosetting curing agent and a polyphenylene ether copolymer. The polyphenylene ether copolymer has an intrinsic viscosity ranging (Continued)

from 0.03 dl/g to 0.14 dl/g, inclusive. The intrinsic viscosity is measured in methylene chloride at 25° C. And the polyphenylene ether copolymer has, at a molecular terminal, a group represented by one of formula (1) and formula (2) at an average number of more than or equal to 0.8 and less than 1.5 per one molecule. Further, the metal foil includes a barrier layer containing cobalt on a first surface of the metal foil. The first surface is in contact with the insulating layer, and has a ten-point average roughness (Rz) of less than or equal to 2.0 μm. In formula (1), $R^1$ represents a hydrogen atom or an alkyl group having 1 to 10 carbon atoms, and $R^2$ represents an alkylene group having 1 to 10 carbon atoms. In formula (2), $R^3$ represents a hydrogen atom or an alkyl group having 1 to 10 carbon atoms.

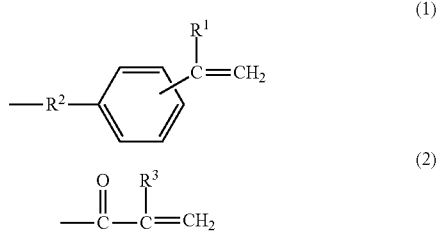

8 Claims, 2 Drawing Sheets

(51) Int. Cl.
| | | |
|---|---|---|
| B32B 27/08 | (2006.01) | |
| H05K 1/03 | (2006.01) | |
| H05K 1/09 | (2006.01) | |
| C08F 290/06 | (2006.01) | |
| B32B 27/00 | (2006.01) | |

(52) U.S. Cl.
CPC ........ *C08F 290/06* (2013.01); *C08F 290/062* (2013.01); *H05K 1/03* (2013.01); *H05K 1/0306* (2013.01); *H05K 1/0313* (2013.01); *H05K 1/09* (2013.01)

(56) References Cited

U.S. PATENT DOCUMENTS

| | | | |
|---|---|---|---|
| 2004/0253814 A1* | 12/2004 | Cheng | H01L 21/76849 257/E21.174 |
| 2005/0121229 A1* | 6/2005 | Takai | B32B 15/09 174/261 |
| 2015/0140296 A1 | 5/2015 | Matsushima et al. | |
| 2015/0218326 A1* | 8/2015 | Kitai | B32B 5/022 428/209 |
| 2017/0226302 A1 | 8/2017 | Saito et al. | |

FOREIGN PATENT DOCUMENTS

| | | | | |
|---|---|---|---|---|
| JP | 2004-025835 | | 1/2004 | |
| JP | 2010/053178 | * | 3/2005 | ............ B32B 15/08 |
| JP | 2007-305963 | | 11/2007 | |
| JP | 2010/195970 | * | 9/2010 | ............ B32B 15/08 |
| JP | 2013/023517 | * | 2/2013 | ............ B32B 15/08 |
| JP | 2015-122448 | | 7/2015 | |
| JP | 2015-199328 | | 11/2015 | |
| WO | 2004/067634 | | 8/2004 | |
| WO | 2013/161905 | | 10/2013 | |
| WO | 2014/034103 | | 3/2014 | |
| WO | 2016/038878 | | 3/2016 | |

OTHER PUBLICATIONS

Fujiwara—JP 2010-053178 A—MT—polyphenylene ether w- 1 or 2 ends—metal-clad—2010 (Year: 2010).*
Onizuka—JP 2010-195970 A—MT—modified polyphenylene ether—1 or 2 ends—cured laminate—2010 (Year: 2010).*
Kitai—JP 2003-023517—MT—polyphenylene ether w- 1 or 2 ends—metal-clad—2013 (Year: 2013).*
Search Report for Chinese Patent Application No. 201780058668.3, dated Aug. 4, 2020, English Translation.
International Search Report of PCT application No. PCT/JP2017/032760 dated Nov. 28, 2017.

* cited by examiner

METAL-CLAD LAMINATE, PRINTED WIRING BOARD AND METAL FOIL WITH RESIN

CROSS-REFERENCE TO RELATED APPLICATIONS

This application is a U.S. national stage application of the PCT International Application No. PCT/JP2017/032760 filed on Sep. 12, 2017, which claims the benefit of foreign priority of Japanese patent application 2016-188058 filed on Sep. 27, 2016, the contents all of which are incorporated herein by reference.

TECHNICAL FIELD

The present disclosure relates to a metal-clad laminate, a printed wiring board, and a metal foil with resin.

BACKGROUND

In recent years, along with an increase in amount of information to be processed, mounting techniques involving, for example, high integration of a semiconductor device to be incorporated, high density of wiring, and multilayering are rapidly being developed in various electronic devices.

Recently, a printed wiring board compatible with high-frequency waves, such as a millimeter-wave radar substrate for in-vehicle use is also required. However, there has been a problem that a transmission loss due to a conductor or a dielectric body arises when a conductor circuit transmits a high frequency signal.

One known approach to address such a problem is use of a polyphenylene ether-containing resin or the like which has a small dielectric constant and a small dielectric dissipation factor for the dielectric body so as to reduce the transmission loss caused by the dielectric body (See, for example, International Publication No. WO 2014/034103).

A high frequency signal concentrates in a superficial part of a conductor due to the skin effect. Meanwhile, a surface of a metal foil in a metal-clad laminate is usually roughened so as to improve the adhesive strength with a dielectric. Therefore, the signal transmits along the roughness of the roughened metal foil surface.

Thus, a technique for shortening the transmission distance by reducing the surface roughness of the metal foil so as to reduce the transmission loss caused by the conductor is reported (See Unexamined Japanese Patent Publication No. 2004-25835). Unexamined Japanese Patent Publication No. 2004-25835 reports subjecting the surface of the metal foil, through which a high frequency signal transmits, to a rustproofing treatment mainly with nickel.

Moreover, International Publication No. WO 2004/67634 discloses a method of producing a polyphenylene ether copolymer.

SUMMARY

A metal-clad laminate according to a first aspect of the present disclosure includes an insulating layer including a cured product of a resin composition, and a metal foil disposed on at least one principal surface of the insulating layer. The resin composition includes a thermosetting curing agent and a polyphenylene ether copolymer. The polyphenylene ether copolymer has an intrinsic viscosity ranging from 0.03 dl/g to 0.14 dl/g, inclusive. The intrinsic viscosity is measured in methylene chloride at 25° C. And the polyphenylene ether copolymer has, at a molecular terminal, a group represented by one of formula (1) and formula (2) at an average number of more than or equal to 0.8 and less than 1.5 per one molecule. Further, the metal foil includes a barrier layer containing cobalt on a first surface of the metal foil. The first surface is in contact with the insulating layer, and has a ten-point average roughness (Rz) of less than or equal to 2.0 μm.

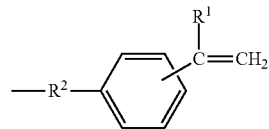

In formula (1), $R^1$ represents a hydrogen atom or an alkyl group having 1 to 10 carbon atoms, and $R^2$ represents an alkylene group having 1 to 10 carbon atoms.

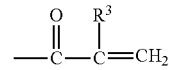

In formula (2), $R^3$ represents a hydrogen atom or an alkyl group having 1 to 10 carbon atoms.

Further, in the metal-clad laminate described above, it is preferred that the group represented by formula (1) is at least one selected from the group consisting of a p-ethenylbenzyl group and a m-ethenylbenzyl group.

Further, in the metal-clad laminate described above, it is preferred that the insulating layer includes a glass substrate.

Further, in the metal-clad laminate described above, it is preferred that the glass substrate has a relative dielectric constant of less than or equal to 5.0, and the insulating layer has a relative dielectric constant of less than or equal to 4.0.

A printed wiring board according to a second aspect of the present disclosure includes the metal-clad laminate described above and a conductor pattern as a circuit on a surface of the metal-clad laminate.

A metal foil with resin according to a third aspect of the present disclosure includes an insulating layer includes a half-cured product of a resin composition, and a metal foil disposed on a principal surface of the insulating layer. The resin composition includes a thermosetting curing agent and a polyphenylene ether copolymer. The polyphenylene ether copolymer has an intrinsic viscosity ranging from 0.03 dl/g to 0.14 dl/g, inclusive. The intrinsic viscosity is measured in methylene chloride at 25° C. And the polyphenylene ether copolymer has, at a molecular terminal, a group represented by one of formula (1) and formula (2) at an average number of more than or equal to 0.8 and less than 1.5 per one molecule. Further, the metal foil includes a barrier layer containing cobalt on a first surface of the metal foil. The first surface is in contact with the insulating layer, and has a ten-point average roughness (Rz) of less than or equal to 2.0 μm.

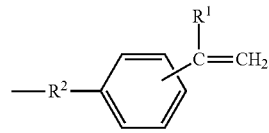

In formula (1), $R^1$ represents a hydrogen atom or an alkyl group having 1 to 10 carbon atoms, and $R^2$ represents an alkylene group having 1 to 10 carbon atoms.

(2)

In formula (2), $R^3$ represents a hydrogen atom or an alkyl group having 1 to 10 carbon atoms.

Further, in the metal foil with resin as described above, it is preferred that the group represented by formula (1) is at least one selected from the group consisting of a p-ethenylbenzyl group and a m-ethenylbenzyl group.

A printed wiring board according to a fourth aspect of the present disclosure includes the metal foil with resin as described above and a conductor pattern as a circuit on a surface of the metal foil with resin.

According to the present disclosure, it is possible to provide a metal-clad laminate and a metal foil with resin having excellent heat resistance and transmission characteristics as well as moldability, capable of reducing a transmission loss (transmission loss is less likely to increase) even in transmission of a high frequency signal.

DESCRIPTION OF EMBODIMENT

Figure 1:
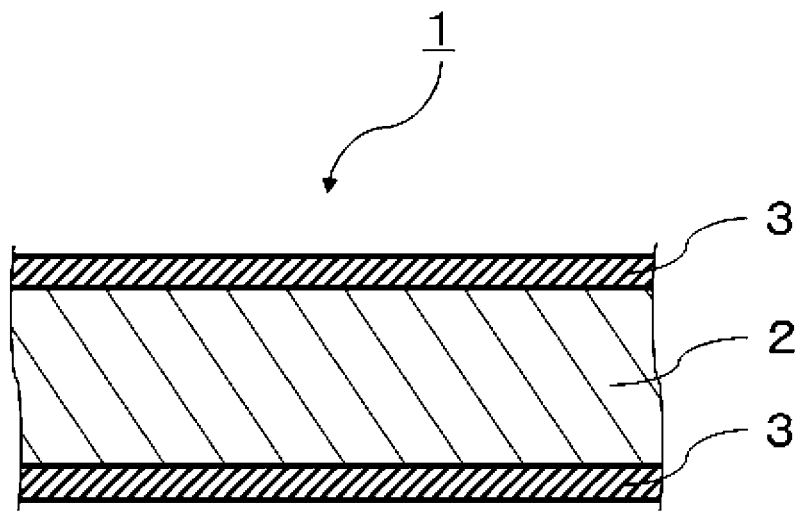
FIG. 1 is a sectional view illustrating a metal-clad laminate according to an exemplary embodiment.

Prior to description of exemplary embodiments of the present disclosure, problems found in conventional techniques will briefly be described. Nickel that has been conventionally used in a rustproofing treatment of a metal foil is excellent in heat resistance, but has a problem that reduction of the transmission loss is hindered because of high electrical resistance of nickel. This tendency is significant particularly when dielectric characteristics of the insulating layer (resin) are decreased or a signal frequency is increased, and amelioration in such a tendency is required. In addition, from the viewpoint of improving moldability, satisfactory resin fluidity is also required.

The present disclosure has been devised in consideration of such circumstances, and provides a metal-clad laminate and a metal foil with resin having excellent moldability and capable of reducing a transmission loss even in transmission of a high frequency signal while keeping dielectric characteristics and heat resistance.

As described above, various characteristics are required for a metal-clad laminate or a metal foil with resin having an insulating layer formed of a resin composition that are used as electronic materials.

First of all, for realizing high speed communications, it is required that the surface of the metal foil to be laminated is relatively smooth (low roughness) and is small in metal resistance so as to achieve excellent transmission characteristics, as well as dielectric characteristics such as a low dielectric constant, a low dielectric dissipation factor or the like. Then, for higher multi-layering to improve the wiring density and for environmental friendliness (lead free), characteristics such as high Tg, heat resistance, lower α, and fluidity of a prepreg (a half-cured product of a resin composition) as a substrate material are required.

In order to achieve these characteristics, the metal-clad laminate of the present exemplary embodiment includes an insulating layer including a cured product of a resin composition, and a metal foil disposed on at least one principal surface of the insulating layer. The resin composition includes a thermosetting curing agent and a polyphenylene ether copolymer. The polyphenylene ether copolymer has an intrinsic viscosity ranging from 0.03 dl/g to 0.14 dl/g, inclusive. The intrinsic viscosity is measured in methylene chloride at 25° C. And the polyphenylene ether copolymer has, at a molecular terminal, a group represented by one of formula (1) and formula (2) at an average number of more than or equal to 0.8 and less than 1.5 per one molecule. Further, the metal foil includes a barrier layer containing cobalt on a first surface of the metal foil. The first surface is in contact with the insulating layer, and has a ten-point average roughness (Rz) of less than or equal to 2.0 μm.

The metal-clad laminate of the present disclosure is capable of reducing the transmission loss by using cobalt having lower electrical resistance than nickel in the rustproofing treatment of the metal foil. Here, cobalt generally tends to be inferior to nickel in heat resistance. Meanwhile, a polyphenylene ether-containing resin has the characteristics of excellent heat resistance in addition to the small dielectric constant and small dielectric dissipation factor. Therefore, it is assumed that combination of use of cobalt in the rustproofing treatment of the metal foil, and use of a polyphenylene ether-containing resin as a dielectric body achieves reduction in transmission loss and improvement in heat resistance.

In the following, each configuration of a metal-clad laminate of the present exemplary embodiment is specifically described.

[Metal-Clad Laminate]

FIG. 1 is a sectional view illustrating a metal-clad laminate according to an exemplary embodiment. Metal-clad laminate 1 of the present exemplary embodiment includes insulating layer 2 including a cured product of a resin composition, and a metal foil disposed on one or both sides of insulating layer 2.

In the present exemplary embodiment, a cured product of a resin composition refers to the resin composition that has proceeded with a curing reaction and does not melt due to cross-linking of the resin even when heated. It should be noted that the half-cured product of a resin composition in later-described metal foil with resin refers to the resin composition in a middle stage of a curing reaction of thermosetting resin, namely the resin composition that once melts and proceeds with a curing reaction when subjected to a rise in temperature.

[Insulating Layer]

Insulating layer 2 of metal-clad laminate 1 of the present exemplary embodiment includes a cured product of a resin composition described below. Further, insulating layer 2 may contain a later-described glass substrate. A thickness of the insulating layer is not particularly limited, but ranges about from 20 μm to 800 μm, inclusive.

(Resin Composition)

The resin composition constituting insulating layer 2 of the present exemplary embodiment includes a thermosetting curing agent and a polyphenylene ether copolymer having an intrinsic viscosity ranging from 0.03 dl/g to 0.14 dl/g, inclusive, and having, at a molecular terminal, a group represented by one of formula (1) and formula (2) at an average number of more than or equal to 0.8 and less than 1.5 per one molecule. Here, the intrinsic viscosity is measured in methylene chloride at 25° C.

By using such a polyphenylene ether resin composition, it is possible to obtain metal-clad laminate 1 having excellent dielectric characteristics and heat resistance. Further, excellent reactivity that contributes to the curing reaction and excellent preservation stability, and excellent fluidity due to low viscosity also provide an advantage of excellent moldability in the cured product.

The polyphenylene ether copolymer used in the present exemplary embodiment is not particularly limited as long as the polyphenylene ether copolymer has an intrinsic viscosity ranging from 0.03 dl/g to 0.14 dl/g, inclusive, and has, at a molecular terminal, a group represented by one of formula (1) and formula (2) at an average number of more than or equal to 0.8 and less than 1.5 per one molecule. Here, the intrinsic viscosity is measured in methylene chloride at 25° C.

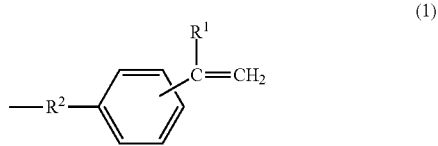

(1)

In formula (1), $R^1$ represents a hydrogen atom or an alkyl group having 1 to 10 carbon atoms, and $R^2$ represents an alkylene group having 1 to 10 carbon atoms.

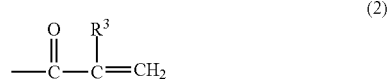

(2)

In formula (2), $R^3$ represents a hydrogen atom or an alkyl group having 1 to 10 carbon atoms.

In formula (1) above, $R^1$ represents a hydrogen atom or an alkyl group having 1 to 10 carbon atoms. The alkyl group having 1 to 10 carbon atoms is not particularly limited as long as the alkyl group is an alkyl group having 1 to 10 carbon atoms, and may be in the form of a straight chain or a branched chain. Specific examples include a methyl group, an ethyl group, a n-propyl group, an isopropyl group, a n-butyl group, an isobutyl group, a s-butyl group, a t-butyl group, a pentyl group, an isopentyl group, a neopentyl group, and a hexyl group. Among these, a hydrogen atom is preferred.

In formula (1), $R^2$ represents an alkylene group having 1 to 10 carbon atoms. The alkylene group having 1 to 10 carbon atoms may be any alkylene groups having 1 to 10 carbon atoms including a methylene group, an ethylene group, a propylene group, a butylene group, a pentylene group, a hexylene group, a heptylene group, an octylene group, a nonylene group, and a decylene group. Among these, a methylene group is preferred.

Further, the group represented by formula (1) is preferably, but is not particularly limited to, at least one selected from the group consisting of a p-ethenylbenzyl group and a m-ethenylbenzyl group. It is considered that this makes it possible to obtain the effects described above more certainly.

The group represented by formula (1) may be a single group exemplified in the above, or a combination of two or more groups exemplified in the above.

In formula (2), $R^3$ represents a hydrogen atom or an alkyl group having 1 to 10 carbon atoms. The alkyl group having 1 to 10 carbon atoms is not particularly limited as long as the alkyl group is an alkyl group having 1 to 10 carbon atoms, and may be in the form of a straight chain or a branched chain. Specific examples include a methyl group, an ethyl group, a n-propyl group, an isopropyl group, a n-butyl group, an isobutyl group, a s-butyl group, a t-butyl group, a pentyl group, an isopentyl group, a neopentyl group, and a hexyl group. Among these, a hydrogen atom is preferred.

In the present exemplary embodiment, in particular, it is more preferable to use a polyphenylene ether copolymer having at a molecular terminal, an average more than or equal to 0.8 and less than 1.5 groups represented by formula (1) per one molecule.

The intrinsic viscosity of the polyphenylene ether copolymer according to the present exemplary embodiment can ranges from 0.03 dl/g to 0.14 dl/g, inclusive, and preferably from 0.04 dl/g to 0.14 dl/g, inclusive, more preferably from 0.06 dl/g to 0.14 dl/g, inclusive. If the intrinsic viscosity is too low, the molecular weight tends to be low, and low dielectric property such as low dielectric constant and low dielectric dissipation factor tends to be difficult to be obtained. If the intrinsic viscosity is too high, sufficient fluidity is not obtained, and the moldability of the cured product tends to deteriorate. Therefore, when the intrinsic viscosity of the polyphenylene ether copolymer falls within the above range, it is possible to realize excellent heat resistance and moldability of the cured product.

The intrinsic viscosity referred to in the present exemplary embodiment is intrinsic viscosity measured in methylene chloride at 25° C., more specifically, for example, a value or the like obtained by measuring a 0.18 g/45 mL solution in methylene chloride (liquid temperature 25° C.) by a viscometer. Examples of the viscometer include ViscoSystem AVS 500 manufactured by SCHOTT Instruments GmbH.

In the polyphenylene ether copolymer according to the present exemplary embodiment, an average number of the group represented by one of formula (1) and (2) at a molecular terminal, per one molecule of the polyphenylene ether copolymer (number of terminal functional groups) can be more than or equal to 0.8 and less than 1.5, and preferably ranges from 0.8 to 1.3, inclusive, more preferably ranges from 0.8 to 1.1, inclusive. If the number of terminal functional groups is too small, it is considered that a cross linking point or the like become difficult to be formed. Hence, it tends to be difficult to obtain the cured product having sufficient heat resistance. If the number of terminal functional groups is too large, the reactivity is too high. Hence, problems such as deterioration in preservability of the resin composition, deterioration in fluidity of the resin composition, or inferiority in moldability may occur.

The number of terminal functional groups of the polyphenylene ether copolymer can be a numerical value showing an average value of the group represented by one of formula (1) and (2) per one molecule for all the polyphenylene ether copolymers existing in 1 mol of polyphenylene ether. The number of terminal functional groups can be determined, for example, by measuring the number of hydroxyl groups remaining in the obtained polyphenylene ether copolymer, and calculating a decrement from the number of hydroxyl groups of the polyphenylene ether copolymer before modification. The decrement from the number of hydroxyl groups of the polyphenylene ether copolymer before modification is a number of terminal functional groups. The number of hydroxyl groups remaining in the polyphenylene ether copolymer after modification can be determined by adding a quaternary ammonium salt that associates with a hydroxyl group (tetraethylammonium hydroxide) to the solution of the polyphenylene ether copolymer, and measuring the UV absorption of the resultant mixed solution.

A weight average molecular weight of the polyphenylene ether copolymer used in the present exemplary embodiment is preferably, but not particularly limited to, more than or equal to 1000. Further, the weight average molecular weight of the polyphenylene ether copolymer used in the present exemplary embodiment preferably ranges from 1000 to 12000, inclusive, more preferably ranges from 1000 to 10000, inclusive, further preferably ranges from 2000 to 10000, inclusive. The weight average molecular weight can be measured by a general molecular weight measuring method, and can be specifically a value measured by using gel permeation chromatography (GPC).

It is assumed that a resin composition having excellent dielectric characteristics of polyphenylene ether and giving high Tg and excellent adhesiveness and heat resistance with good balance in a cured product of the resin composition can be obtained more certainly, when the weight average molecular weight of the polyphenylene ether copolymer falls within such a range.

The polyphenylene ether copolymer according to the present exemplary embodiment has a polyphenylene ether chain in the molecule, and preferably has, for example, a repeating unit represented by formula (3) in the molecule.

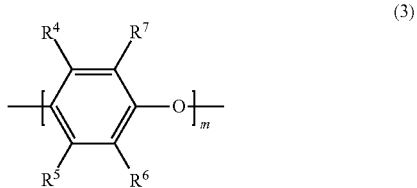

(3)

In formula (3), m represents 1 to 50. $R^4$, $R^5$, $R^6$ and $R^7$ are independent from one another. That is, $R^4$, $R^5$, $R^6$ and $R^7$ may be the same group, or different groups. $R^4$, $R^5$, $R^6$ and $R^7$ each represent a hydrogen atom, an alkyl group, an alkenyl group, an alkynyl group, a formyl group, an alkylcarbonyl group, an alkenylcarbonyl group, or an alkynylcarbonyl group. Among these, a hydrogen atom and an alkyl group are preferred.

In $R^4$, $R^5$, $R^6$ and $R^7$, specific examples of the functional groups are as follows.

The alkyl group is not particularly limited, but is preferably an alkyl group having 1 to 18 carbon atoms, and more preferably an alkyl group having 1 to 10 carbon atoms, for example. Specific examples include a methyl group, an ethyl group, a propyl group, a hexyl group, and a decyl group.

The alkenyl group is not particularly limited, but is preferably an alkenyl group having 2 to 18 carbon atoms, and more preferably an alkenyl group having 2 to 10 carbon atoms, for example. Specific examples include a vinyl group, an allyl group, and a 3-butenyl group.

The alkynyl group is not particularly limited, but is preferably an alkynyl group having 2 to 18 carbon atoms, and more preferably an alkynyl groups having 2 to 10 carbon atoms, for example. Specific examples include an ethynyl group, and a prop-2-yn-1-yl group (propargyl group).

While the alkylcarbonyl group is not particularly limited as long as it is a carbonyl group substituted by an alkyl group, for example, an alkylcarbonyl group having 2 to 18 carbon atoms is preferred, and an alkylcarbonyl group having 2 to 10 carbon atoms is more preferred. Specific examples include an acetyl group, a propionyl group, a butyryl group, an isobutyryl group, a pivaloyl group, a hexanoyl group, an octanoyl group, and a cyclohexylcarbonyl group.

While the alkenylcarbonyl group is not particularly limited as long as it is a carbonyl group substituted by an alkenyl group, for example, an alkenylcarbonyl group having 3 to 18 carbon atoms is preferred, and an alkenylcarbonyl group having 3 to 10 carbon atoms is more preferred. Specific examples include an acryloyl group, a methacryloyl group, and a crotonoyl group.

While the alkynylcarbonyl group is not particularly limited as long as it is a carbonyl group substituted by an alkynyl group, for example, an alkynylcarbonyl group having 3 to 18 carbon atoms is preferred, and an alkynylcarbonyl group having 3 to 10 carbon atoms is more preferred. Specific examples include a propioloyl group.

When the polyphenylene ether copolymer has a repeating unit represented by formula (3) in the molecule, m is preferably such a numerical value that the weight average molecular weight of the polyphenylene ether copolymer falls within the range as described above. Specifically, m is preferably 10 to 100.

A synthetic method of the polyphenylene ether copolymer used in the present exemplary embodiment is not particularly limited as long as the synthetic method is a method for obtaining a copolymer as described above. Specific examples include a method of reacting a polyphenylene ether in which a hydrogen atom of a terminal phenolic hydroxyl group is substituted with an alkali metal atom such as sodium or potassium, and a compound represented by formula (4).

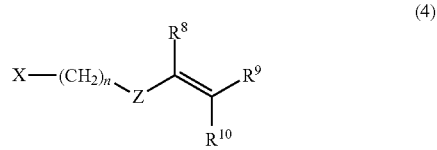

(4)

In formula (4), n represents an integer of 0 to 10, Z represents an arylene group, and $R^8$ to $R^{10}$ each independently represent a hydrogen atom or an alkyl group. X represents a halogen atom, and specific examples of X include a chlorine atom, a bromine atom, an iodine atom, and a fluorine atom. Among these, a chlorine atom is preferred.

The compound represented by formula (4) is not particularly limited, but is preferably p-chloromethylstyrene or m-chloromethylstyrene, for example.

The compound represented by formula (4) may be a single compound exemplified in the above, or a combination of two or more compounds exemplified in the above.

The polyphenylene ether copolymer of the present exemplary embodiment can be produced by the known method as disclosed in International Publication No. WO 2004/67634, for example.

Specifically, a polyphenylene ether having a repeating unit represented by formula (3) and a compound represented by formula (4) are dissolved in a solvent and stirred. In this manner, the polyphenylene ether and the compound represented by formula (4) react with each other to give a modified polyphenylene ether copolymer used in the present exemplary embodiment.

This reaction is preferably carried out in presence of an alkali metal hydroxide. This manner is considered to suitably progress the reaction.

The alkali metal hydroxide is not particularly limited as long as the alkali metal hydroxide is capable of functioning as a dehalogenation agent, and examples include sodium hydroxide. The alkali metal hydroxide is typically used in a state of an aqueous solution and used specifically as a sodium hydroxide aqueous solution.

The reaction conditions such as reaction time, reaction temperature, and the like vary depending on the compound represented by formula (4), and are not particularly limited as long as the conditions allow favorable progression of the reaction as described above. Specifically, the reaction temperature preferably ranges from room temperature to 100° C., inclusive, more preferably ranges from 30° C. to 100° C., inclusive. The reaction time preferably ranges from 0.5 hours to 20 hours, inclusive, more preferably ranges from 0.5 hours to 10 hours, inclusive.

The solvent used in the reaction is not particularly limited as long as the solvent is capable of dissolving a polyphenylene ether and a compound represented by formula (4), and does not inhibit the reaction between the polyphenylene ether and the compound represented by formula (4). Specific examples include toluene.

The reaction is preferably carried out while not only the alkali metal hydroxide but also a phase transfer catalyst is present. That is, the reaction is preferably carried out in presence of the alkali metal hydroxide and a phase transfer catalyst. This manner is considered to more suitably progress the reaction.

The phase transfer catalyst is not particularly limited, and examples include quaternary ammonium salts such as tetra-n-butyl ammonium bromide.

Preferably, the resin composition according to the present exemplary embodiment contains a modified polyphenylene ether copolymer obtained in the manner as described above as a polyphenylene ether copolymer.

As the thermosetting curing agent used in the present exemplary embodiment, those capable of forming cross links and curing by reaction with the polyphenylene ether copolymer are recited. Specific examples include compounds having two or more unsaturated double bonds in the molecule. More specific examples include trialkenylisocyanurate compounds such as triallyl isocyanurate (TAIC), multifunctional methacrylate compounds having two or more methacryl groups in the molecule, multifunctional acrylate compounds having two or more acryl groups in the molecule, and vinyl compounds having two or more vinyl groups in the molecule (multifunctional vinyl compounds) such as polybutadiene. Among these, trialkenylisocyanurate compounds, multifunctional acrylate compounds having two or more acryl groups in the molecule, multifunctional methacrylate compounds, and multifunctional vinyl compounds are preferred. It is considered that cross links are formed more favorably by the curing reaction using such a compound, and it is possible to further improve the heat resistance of the cured product of the resin composition containing the polyphenylene ether copolymer according to the present exemplary embodiment. The thermosetting curing agent may be a single compound exemplified in the above, or a combination of two or more compounds exemplified in the above. As the thermosetting curing agent, a combination of a compound having two or more unsaturated double bonds in the molecule, and a compound having one unsaturated double bond in the molecule may be used. Specific examples of the compound having one unsaturated double bond in the molecule include compounds having one vinyl group in the molecule (monovinyl compounds).

Also, a content proportion of the polyphenylene ether polymer in the resin composition of the present exemplary embodiment is not particularly limited as long as the content proportion provides formation of a cured product by reaction with the thermosetting curing agent. For example, the content proportion of the polyphenylene ether polymer preferably ranges from 30 mass % to 95 mass %, inclusive, more preferably ranges from 40 mass % to 90 mass %, inclusive, further preferably ranges from 50 mass % to 90 mass %, inclusive, relative to a total amount of the polyphenylene ether polymer and the thermosetting curing agent. In other words, the content proportion of the thermosetting curing agent preferably ranges from 5 mass % to 70 mass %, inclusive, more preferably ranges from 10 mass % to 60 mass %, inclusive, further preferably ranges from 10 mass % to 50 mass %, inclusive, relative to the total amount of the polyphenylene ether polymer and the thermosetting curing agent. It is considered that this content proportion gives more excellent moldability and heat resistance in the cured product while retaining excellent dielectric characteristics of the polyphenylene ether. This is attributable to the fact that cross links are favorably formed by the curing reaction while the content proportion of the polyphenylene ether capable of exerting excellent dielectric characteristics is retained.

The resin composition used in the present exemplary embodiment may be composed of a polyphenylene ether polymer and a thermosetting curing agent, or may additionally contain other component. Examples of the other component include an inorganic filler, a flame retardant, an additive, and a reaction initiator. Even when other component is contained, the total content proportion of the polyphenylene ether polymer and the thermosetting curing agent, relative to an entire resin composition, is preferably more than or equal to 30 mass %, more preferably ranges from 30 mass % to 90 mass %, inclusive, further preferably ranges from 40 mass % to 80 mass %, inclusive.

While the inorganic filler that can be used in the present exemplary embodiment is not particularly limited, an inorganic filler or the like capable of improving the heat resistance or flame resistance of the cured product of the resin composition can be recited. Specific examples include silica, alumina, talc, ammonium hydroxide, magnesium hydroxide, titanium oxide, mica, aluminum borate, barium sulfate, and calcium carbonate. These inorganic fillers may be used as they are, but are particularly preferably subjected to a surface treatment with a silane coupling agent of a vinyl silane type, a styryl silane type, a methacryl silane type, or an acryl silane type. The metal-clad laminate obtained by using a resin composition in which an inorganic filler having subjected to a surface treatment with such a silane coupling agent has high heat resistance in moisture absorption and tends to have high interlayer peeling strength.

When an inorganic filler is contained, a content proportion of the inorganic filler preferably ranges from 5 mass % to 60 mass %, inclusive, more preferably ranges from 10 mass % to 60 mass %, inclusive, further preferably ranges from 15 mass % to 50 mass %, inclusive, relative to the entire resin composition.

The resin composition of the present exemplary embodiment may additionally contain a flame retardant for further improving the flame resistance of the cured product of the resin composition. The flame retardant that can be used is not particularly limited, and specific examples of the flame retardant include halogenic flame retardants such as bromic flame retardants, and phosphoric flame retardants. Specific examples of the halogenic flame retardants include bromic flame retardants such as pentabromodiphenyl ether, octabromodiphenyl ether, decabromodiphenyl ether, tetrabromobisphenol A, and hexabromocyclododecane, and chloric flame retardants such as chlorinated paraffin. Specific examples of the phosphoric flame retardants include phosphoric acid esters such as condensed phosphoric acid ester or cyclic phosphoric acid ester, phosphazene compounds such as cyclic phosphazene compound, phosphinate flame retardants such as phosphinic acid metal salts, e.g., dialkylphosphinic acid aluminum salt, and melamine flame retardants such as melamine phosphate and melamine polyphosphate. The flame retardant may be a single flame retardant exemplified in the above, or a combination of two or more flame retardants exemplified in the above.

The curing reaction can proceed even when the resin composition of the present exemplary embodiment is composed of a polyphenylene ether copolymer and a thermosetting curing agent. However, since it is sometimes the case that high temperature is difficult to be applied until the curing proceeds depending on the process condition, a reaction initiator may be added. The reaction initiator is not particularly limited as long as the reaction initiator can promote the curing reaction of the polyphenylene ether copolymer and the thermosetting curing agent. Specific examples include oxidizing agents such as $\alpha,\alpha'$-bis(t-butylperoxy-m-isopropyl)benzene, 2,5-dimethyl-2,5-di(t-butylperoxy)-3-hexyne, benzoyl peroxide, 3,3',5,5'-tetramethyl-1,4-diphenoquinone, chloranil, 2,4,6-tri-t-butylphenoxyl, t-butylperoxyisopropyl monocarbonate, and azobisisobutyronitrile. Further, a carboxylic acid metal salt or the like can be used in combination as necessary. This makes it possible to further promote the curing reaction. Among these, $\alpha,\alpha'$-bis(t-butylperoxy-m-isopropyl)benzene is preferably used. Since $\alpha,\alpha'$-bis(t-butylperoxy-m-isopropyl)benzene initiates a reaction at relatively high temperature, it is possible to suppress promotion of the curing reaction at a point of time when curing is not required, such as in prepreg drying, and it is possible to suppress a decrease in preservability of the polyphenylene ether resin composition. Further, $\alpha,\alpha'$-bis(t-butylperoxy-m-isopropyl)benzene having low volatility does not vaporize during prepreg drying and during preservation to be good in stability. The reaction initiators may be used alone or in combination of two or more.

Examples of additives other than the above include antifoaming agents such as a silicone-based antifoaming agent and an acrylate-based antifoaming agent, a thermostabilizer, an antistatic agent, an ultraviolet absorber, a dye and a pigment, a lubricant, and dispersants such as a wet dispersant.

The resin composition according to the present exemplary embodiment is typically prepared into a varnish form, and is often used as resin varnish in production of the metal-clad laminate. Such a resin varnish is prepared as follows, for example.

First, components that are soluble in an organic solvent, such as a polyphenylene ether copolymer, a thermosetting curing agent, and a compatible type flame retardant as necessary, are introduced and dissolved in an organic solvent. In this procedure, the solution may be heated as necessary. Then, a component that is not soluble in the organic solvent, such as an inorganic filler, an incompatible type flame retardant or the like is added and dispersed to a predetermined dispersion state with use of, for example, a ball mill, a bead mill, a planetary mixer, or a roll mill to prepare a varnish resin composition. The organic solvent used here is not particularly limited as long as the organic solvent dissolves a polyphenylene ether copolymer, a thermosetting curing agent, and the like, and does not inhibit the curing reaction. Specific examples include toluene, cyclohexanone, and propyleneglycol monomethyl ether acetate. The organic solvents may be used alone or in combination of two or more.

(Glass Substrate)

Preferably, the insulating layer of the present exemplary embodiment further contains a glass substrate in addition to the cured product of the resin composition. This offers the advantages of preventing a trouble in processing (cracking), reducing the dimensional change, reducing the linear expansion, and controlling a warp.

The glass substrate is not particularly limited, but is more preferably a glass substrate having low dielectric constant. More specifically, it is preferred to set a relative dielectric constant of the glass substrate so that the relative dielectric constant (at 1 GHz) of the insulating layer is less than or equal to 4.0. The relative dielectric constant of the insulating layer within the above range can be realized when the relative dielectric constant of the glass substrate is less than or equal to 5.0.

A glass substrate can be generally used that has a thickness of, for example, about 0.04 mm to 0.3 mm.

As such a glass substrate, a commercially available glass substrate can be used, and for example, "E glass" (relative dielectric constant 6.8) or "NE glass" (relative dielectric constant 4.8) manufactured by Nitto Boseki Co., Ltd. can be preferably used. While a glass substrate having a low dielectric constant is generally known to be very expensive, according to the present exemplary embodiment, excellent dielectric characteristics can be achieved even when a relatively low-priced glass substrate such as "E glass" is used. Therefore, using such a glass substrate having a low dielectric constant is very useful also from the viewpoint of lowering the production cost.

When the insulating layer of the present exemplary embodiment contains a glass substrate, a prepreg obtained by impregnating the glass substrate with the resin composition described above may be used. As a method for producing such a prepreg, there is exemplified a method of impregnating the glass substrate with the resin varnish described above (resin composition prepared into a varnish form), followed by drying.

The impregnation of the glass substrate with the resin varnish is performed by, for example, immersion or application. This impregnation can be repeated a plurality of times as necessary. In this procedure, it is also possible to repeat the impregnation with use of a plurality of types of resin varnish that are different in composition and concentration, for adjusting the composition and the amount of resin to finally desired composition and amount of resin.

The glass substrate that has been impregnated with the resin varnish is heated under desired heating conditions of, for example, a temperature ranging from 80° C. to 170° C., inclusive, and a period ranging from 1 minute to 10 minutes, inclusive, to give a prepreg in a half-cured state (stage B).

The glass substrate may be used as it is, but is particularly preferably subjected to a surface treatment with a silane coupling agent of a vinyl silane type, a styryl silane type, a methacryl silane type, or an acryl silane type. The metal-clad laminate containing a glass substrate having subjected to a surface treatment with such a silane coupling agent has high heat resistance in moisture absorption and tends to have high interlayer peeling strength.

[Metal Foil]

Metal-clad laminate 1 of the present exemplary embodiment includes metal foil 3 on either or both sides of insulating layer 2. And metal foil 3 has a barrier layer containing cobalt (Co) on a surface (first surface) of metal foil 3. The surface (first surface) of metal foil 3 is in contact with insulating layer 2, and has a ten-point average roughness (Rz) of less than or equal to 2.0 μm.

When a conductor circuit transmits a high frequency signal, the signal concentrates in a superficial part of the conductor due to the skin effect. Since metal foil 3 used in the present exemplary embodiment has a ten-point average roughness (Rz) as low as less than or equal to 2.0 μm at the surface in contact with insulating layer 2 which is a dielectric body, it is considered that the transmission distance is shortened, and the transmission loss can be reduced. While a lower limit of the ten-point average roughness (Rz) of the surface of metal foil 3 is not particularly limited as long as the ten-point average roughness (Rz) is less than or equal to 2.0 μm, it is preferred that the ten-point average roughness (Rz) of the surface of metal foil 3 is usually more than or equal to 0.5 μm from the viewpoint of obtaining adhesiveness with insulating layer 2 to some extent. In the present exemplary embodiment, the ten-point average roughness (Rz) means Rz JIS defined in JIS B 0601-2001.

Metal foil 3 used in the present exemplary embodiment is not particularly limited, and for example, a copper foil, a nickel foil, an aluminum foil or the like can be used. From the viewpoint of workability, conductivity or the like, a copper foil is preferably used. A thickness of metal foil 3 is not particularly limited, but preferably ranges about from 12 μm to 70 μm, inclusive.

In the present exemplary embodiment, on at least the surface (first surface) of metal foil 3 which is in contact with insulating layer 2, a barrier layer containing cobalt is formed. It is considered that cobalt is capable of further reducing the transmission loss because cobalt has relatively small electrical resistance. Conventionally, although cobalt tends to be inferior to nickel or the like in heat resistance, in the present exemplary embodiment, it is possible to achieve both the heat resistance and the reduction in transmission loss by using the resin composition containing the polyphenylene ether copolymer as insulating layer 2.

In the present exemplary embodiment, the barrier layer formed on metal foil 3 may contain tin, zinc, nickel or the like in addition to cobalt unless the effect of the present disclosure is impaired. It is preferred that the barrier layer has better not to contain tin and nickel much, in particular, because tin and nickel have high electrical resistance as described above. Also for the purpose of preventing surface oxidization of a copper foil, a rustproofing treatment such as a chromate treatment may be conducted.

Metal foil 3 may be used as it is, but is preferably subjected to silane coupling treatment, and particularly preferably subjected to a surface treatment with a silane coupling agent of a vinyl silane type, a styryl silane type, a methacryl silane type, or an acryl silane type. Metal-clad laminate 1 containing metal foil 3 having subjected to a surface treatment with such a silane coupling agent has high heat resistance in moisture absorption and tends to have high peeling strength.

The barrier layer can be formed by a plating treatment. Specifically, for example, a thin film of cobalt or an alloy of cobalt can be formed on metal foil 3 by sputtering, electroplating or electroless plating.

As metal foil 3 of the present exemplary embodiment, commercially available products can be used, and preferred examples include "T9FZ-SV" (Rz: 1.6 μm) and "T9DA-SV" (Rz: 1.0 μm) manufactured by FUKUDA METAL FOIL & POWDER CO., LTD.

[Method for Producing Metal-Clad Laminate]

Metal-clad laminate 1 of the present exemplary embodiment can be manufactured as a laminate whose one or both surfaces are clad with a metal foil, for example, by stacking one or a plurality of prepregs containing the resin composition as described above, and further stacking metal foil 3 as described above on either or both sides above or below the prepreg stack, followed by heat pressure molding of the resultant stack for lamination and integration.

The heating and pressurizing conditions can be appropriately set depending on the thickness of the laminate to be produced, the kind of the resin composition, and the like. For example, the temperature can range from 170° C. to 220° C., inclusive, the pressure can range from 1.5 MPa to 5.0 MPa, inclusive, and the period can range from 60 minutes to 150 minutes, inclusive.

[Metal Foil with Resin]

Figure 2:
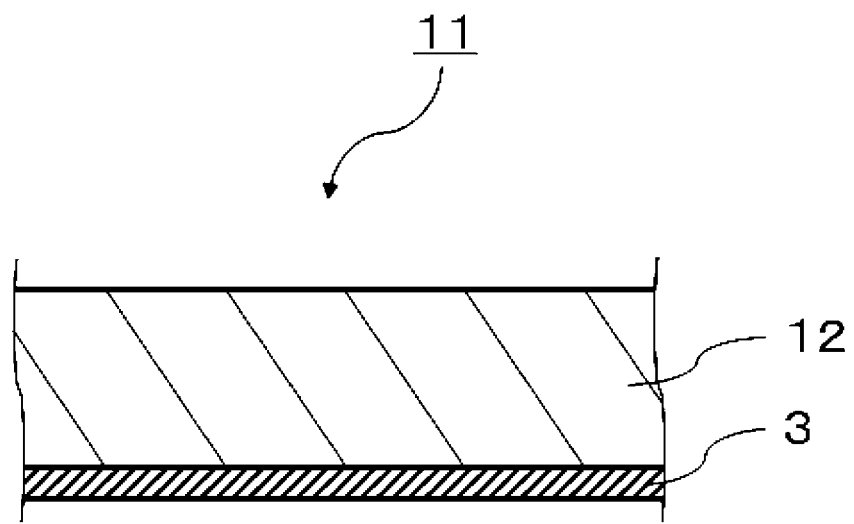
FIG. 2 is a sectional view illustrating a metal foil with resin according to an exemplary embodiment.

FIG. 2 is a sectional view illustrating a metal foil with resin according to an exemplary embodiment. Metal foil with resin 11 of the present exemplary embodiment includes insulating layer 12 formed of a half-cured product of the resin composition described above, and the metal foil disposed on one side (principal surface on one side) of insulating layer 12.

As the resin composition used in insulating layer 12 and metal foil 3, those described in metal-clad laminate 1 described above can be used.

One exemplary method for producing metal foil with resin 11 includes applying the resin varnish obtained in the above procedure on the surface of metal foil 3 where the barrier layer is formed, and then drying the resin varnish to half-cure the resin composition.

Since insulating layer 12 of metal foil with resin 11 typically does not includes a glass substrate, application of the resin varnish to the metal foil is conducted by coating or the like. And the application can be repeated several times as necessary. In this procedure, it is also possible to repeat the application with use of a plurality of types of resin varnish that are different in composition and concentration, for adjusting the composition and resin thickness to a finally desired composition (content ratio) and resin amount.

After application of the resin varnish, the solvent is removed by heating under desired heating conditions of, for example, a temperature ranging from 80° C. to 170° C., inclusive, and a period ranging from 1 minute to 10 minutes, inclusive. By this procedure, metal foil with resin 11 having the resin composition in the half-cured state (stage B) as insulating layer 12 is obtained.

Metal foil with resin 11 of the present exemplary embodiment also has the same effect and advantages as metal-clad laminate 1 described above.

Figure 3:
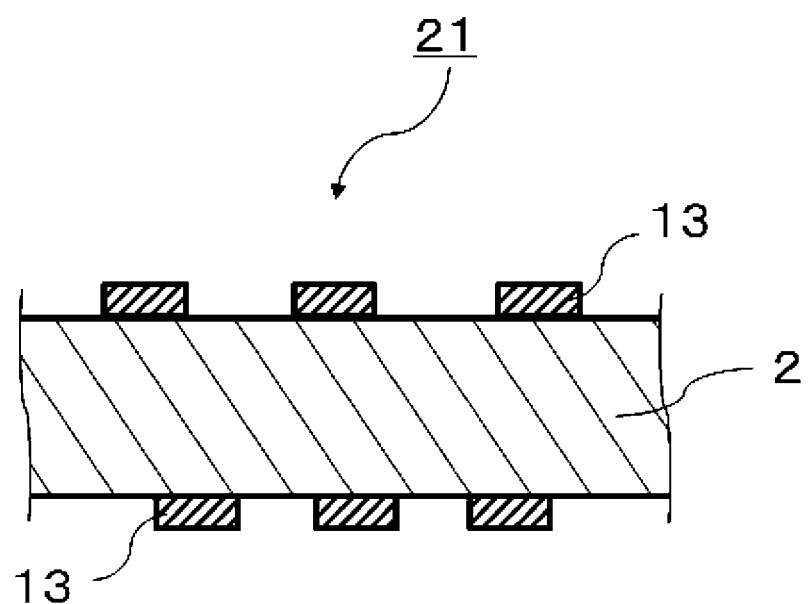
FIG. 3 is a sectional view illustrating a printed wiring board according to an exemplary embodiment.

Metal-clad laminate 1 and metal foil with resin 11 of the present exemplary embodiment can be used as a printed wiring board that is provided with a conductor pattern as a circuit on the surface. Metal foil 3 on the surface of insulating layer 2 is subjected to an etching process or the like so that the conductor pattern is formed as the circuit. FIG. 3 is a sectional view illustrating a printed wiring board according to an exemplary embodiment. Printed wiring board 21 obtained by using metal-clad laminate 1 and metal foil with resin 11 of the present exemplary embodiment is excellent in heat resistance, dielectric characteristics, and transmission characteristics. Additionally, even when printed wiring board 12 is applied to a package form to which a semiconductor chip is joined, an advantage that printed wiring board 21 is easy to mount and has no variation in quality can be obtained.

The present specification discloses various aspects of techniques as described above, from among which main techniques are shown as follows.

A metal-clad laminate according to the present disclosure includes an insulating layer including a cured product of a resin composition, and a metal foil disposed on at least one principal surface of the insulating layer. The resin composition includes a thermosetting curing agent and a polyphenylene ether copolymer. The polyphenylene ether copolymer has an intrinsic viscosity ranging from 0.03 dl/g to 0.14 dl/g, inclusive. The intrinsic viscosity is measured in methylene chloride at 25° C. And the polyphenylene ether copolymer has, at a molecular terminal, a group represented by one of formula (1) and formula (2) at an average number of more than or equal to 0.8 and less than 1.5 per one molecule. The metal foil includes a barrier layer containing cobalt on a first surface of the metal foil. The first surface is in contact with the insulating layer, and has a ten-point average roughness (Rz) of less than or equal to 2.0 μm.

With such a configuration, it is possible to provide an electronic material having excellent dielectric characteristics and heat resistance as well as moldability, and excellent transmission characteristics.

Further, in the metal-clad laminate described above, it is preferred that the group represented by formula (1) is at least one selected from the group consisting of a p-ethenylbenzyl group and a m-ethenylbenzyl group. This makes it possible to obtain the effects described above more certainly.

Further, in the metal-clad laminate described above, it is preferred that the insulating layer includes a glass substrate. This offers the advantages of preventing a trouble in processing (cracking), reducing the dimensional change, reducing the linear expansion, and controlling a warp.

Further, in the metal-clad laminate described above, it is preferred that the glass substrate has a relative dielectric constant of less than or equal to 5.0, and the insulating layer has a relative dielectric constant of less than or equal to 4.0. This makes it possible to obtain more excellent dielectric characteristics more certainly.

A metal foil with resin according to the present disclosure includes an insulating layer including a half-cured product of a resin composition, and a metal foil on a principal surface of the insulating layer. The resin composition includes a thermosetting curing agent and a polyphenylene ether copolymer. The polyphenylene ether copolymer has an intrinsic viscosity ranging from 0.03 dl/g to 0.14 dl/g, inclusive. The intrinsic viscosity is measured in methylene chloride at 25° C. And the polyphenylene ether copolymer has, at a molecular terminal, a group represented by one of formula (1) and formula (2) at an average number of more than or equal to 0.8 and less than 1.5 per one molecule. Further, the metal foil includes a barrier layer containing cobalt on a first surface of the metal foil. The first surface is in contact with the insulating layer, and has a ten-point average roughness (Rz) of less than or equal to 2.0 μm.

With such a configuration, it is possible to provide an electronic material having excellent dielectric characteristics and heat resistance as well as moldability, and excellent transmission characteristics.

Further, in the metal foil with resin as described above, it is preferred that the group represented by formula (1) is at least one selected from the group consisting of a p-ethenylbenzyl group and a m-ethenylbenzyl group. This makes it possible to obtain the effects described above more certainly.

A printed wiring board according to the present disclosure includes the metal-clad laminate as described above or the metal foil with resin as described above, and includes a conductor pattern as a circuit on a surface of the metal-clad laminate or the metal foil with resin.

Hereinafter, the present disclosure is described more specifically by way of examples. A scope of the present disclosure, however, is not limited to these examples.

EXAMPLES

First, a polyphenylene ether copolymer (modified polyphenylene ether copolymer) was synthesized. An average number of phenolic hydroxyl groups at a molecular terminal per molecule of a polyphenylene ether is indicated as a number of terminal hydroxyl groups.

[Synthesis of Modified Polyphenylene Ether 1 (Modified PPE1)]

A polyphenylene ether was reacted with chloromethylstyrene to give modified polyphenylene ether 1 (modified PPE1).

Specifically, in a 1 L three-neck flask equipped with a temperature controller, a stirrer, a cooling installation, and a dropping funnel, 200 g of a polyphenylene ether (polyphenylene ether having a structure shown in formula (3), SA90 manufactured by SABIC Innovative Plastics, intrinsic viscosity (IV) 0.083 dl/g, number of terminal hydroxyl groups 1.9, weight average molecular weight Mw 2000), 30 g of a mixture of p-chloromethylstyrene and m-chloromethylstyrene in a mass ratio of 50:50 (chloromethylstyrene:CMS, manufactured by TOKYO CHEMICAL INDUSTRY CO., LTD.), 1.227 g of tetra-n-butylammonium bromide as a phase transfer catalyst, and 400 g of toluene were introduced and stirred. Then, the resultant mixture was stirred until polyphenylene ether, chloromethylstyrene, and tetra-n-butylammonium bromide were dissolved in toluene. In the procedure, the mixture was gradually heated to a final liquid temperature of 75° C. Then, to a resultant solution, a sodium hydroxide aqueous solution (20 g sodium hydroxide/20 g water) as an alkali metal hydroxide was dropped over 20 minutes. Then, the solution was further stirred at 75° C. for 4 hours. Then, after neutralizing the contents of the flask with 10 mass % hydrochloric acid, a large amount of ethanol was charged. This generated a precipitate in a liquid in the flask. That is, a product contained in a reaction liquid in the flask was reprecipitated. Then, the precipitate was extracted by filtration, washed three times with a mixed liquid of methanol and water in a mass ratio of 80:20, and then dried in vacuo at 80° C. for 3 hours.

The obtained solid was analyzed by $^1$H-NMR (400 MHz, CDCl$_3$, TMS). In the measurement result of NMR, a peak derived from ethenylbenzyl was observed in the range of 5 ppm to 7 ppm. This confirmed that the obtained solid is a modified polyphenylene ether having a group represented by formula (1) at a molecular terminal. Specifically, this confirmed that the resultant solid was an ethenylbenzylated polyphenylene ether.

A number of terminal functional groups of the modified polyphenylene ether was measured as follows.

First, the modified polyphenylene ether was weighed accurately. The weight at that time is defined as X (mg). Then, the weighed modified polyphenylene ether was dissolved in 25 mL of methylene chloride, and to a resultant solution was added 100 μL of a 10 mass % solution of tetraethylammonium hydroxide (TEAH) in ethanol (TEAR: ethanol (volume ratio)=15:85), and then absorbance (Abs) at 318 nm was measured using a UV spectrophotometer (UV-1600 manufactured by Shimadzu Corporation). Then, from a measurement result, the number of terminal hydroxyl groups of the modified polyphenylene ether was calculated by a following formula.

$$\text{Remaining OH amount}(\mu\text{mol/g}) = [(25 \times \text{Abs})/(\varepsilon \times \text{OPL} \times X)] \times 10^6$$

Here, ε represents an absorption coefficient and is 4700 L/mol·cm. Further, OPL is an optical length of a cell and is 1 cm.

Since the calculated remaining OH amount (number of terminal hydroxyl groups) of the modified polyphenylene ether was almost zero, it was found that the hydroxy groups of the polyphenylene ether before modification were almost completely modified. This revealed that a decrement of the number of terminal hydroxy groups from the number of terminal hydroxyl groups of the polyphenylene ether before modification is the number of terminal hydroxyl groups of the polyphenylene ether before modification. That is, it was found that the number of terminal hydroxyl groups of the polyphenylene ether before modification is the number of terminal functional groups of the modified polyphenylene ether. That is to say, the number of terminal functional groups was 1.9.

Intrinsic viscosity (IV) of the modified polyphenylene ether was measured in methylene chloride at 25° C. Specifically, the intrinsic viscosity (IV) of the modified polyphenylene ether was measured in a 0.18 g/45 mL solution of modified polyphenylene ether in methylene chloride (liquid temperature 25° C.) with a viscometer (AVS500 Visco System manufactured by Schott). As a result, the intrinsic viscosity (IV) of the modified polyphenylene ether was 0.086 dl/g.

[Synthesis of Modified Polyphenylene Ether 2 (Modified PPE2)]

Modified PPE2 was synthesized in the same method as in the synthesis of modified PPE1 described above except that a later-described polyphenylene ether was used as the polyphenylene ether, and a later-described condition was employed.

The polyphenylene ether used herein was a polyphenylene ether having a structure represented by formula (3) (SA120 manufactured by SABIC Innovative Plastics, intrinsic viscosity (IV) 0.125 dl/g, number of terminal hydroxyl groups 1).

Next, reaction between a polyphenylene ether and chloromethylstyrene was conducted in the same method as in synthesis of modified PPE1 except that 200 g of the aforementioned polyphenylene ether (SA120), 15 g of CMS, and 0.92 g of a phase transfer catalyst (tetra-n-butylammonium bromide) were used, and a sodium hydroxide aqueous solution (10 g sodium hydroxide/10 g water) was used in place of a sodium hydroxide aqueous solution (20 g sodium hydroxide/20 g water).

Then, the obtained solid was analyzed by $^1$H-NMR (400 MHz, CDCl$_3$, TMS). In the measurement result of NMR, a peak derived from ethenylbenzyl was observed in the range of 5 to 7 ppm. This confirmed that the obtained solid is a modified polyphenylene ether having a group represented by formula (1) at a molecular terminal. Specifically, this confirmed that the resultant solid was an ethenylbenzylated polyphenylene ether.

The number of terminal functional groups of the modified polyphenylene ether was measured in the same method as described above. As a result, the number of terminal functional groups was 1.0.

Intrinsic viscosity (IV) of the modified polyphenylene ether was measured in methylene chloride at 25° C. in the same method as described above. As a result, the intrinsic viscosity (IV) of the modified polyphenylene ether was 0.125 dl/g.

Examples 1 to 5 and Comparative Examples 1 to 3

In the present example, components used in preparing a metal foil with resin (Example 5) and a metal-clad laminate are described.

(Polyphenylene Ether)

Modified PPE1 and 2: A modified polyphenylene ether obtained by the synthesis method described above. SA9000: SA9000 manufactured by SABIC Innovative Plastics (modified polyphenylene ether obtained by modifying a terminal hydroxyl group of the polyphenylene ether of formula (3) with a methacryl group)

(Thermosetting Curing Agent)

TAIC: Triallyl isocyanurate (manufactured by Nihon Kasei Co., Ltd.)

DCP: Tricyclodecane dimethanol diacrylate (manufactured by Shin Nakamura Chemical Co., Ltd.)

(Reaction Initiator)

Initiator: 1,3-Bis(butylperoxyisopropyl)benzene (PERBUTYL P, manufactured by NOF CORPORATION)

(Inorganic Filler)

Spherical silica: "SC2300-SVJ", manufactured by Admatechs.

(Metal Foil)

Copper foil (1): Copper foil having a cobalt barrier layer "T9FZ-SV" (manufactured by FUKUDA METAL FOIL & POWDER CO., LTD., Rz: 1.6, Thickness 18 μm)

Copper foil (2): Copper foil having a Ni (nickel) barrier layer "T4X-SV" (manufactured by FUKUDA METAL FOIL & POWDER CO., LTD., Rz: 1.1, Thickness 18 μm)

Copper foil (3): Copper foil having a cobalt barrier layer "T9DA-SV" (manufactured by FUKUDA METAL FOIL & POWDER CO., LTD., Rz: 1.0, Thickness 18 μm)

Copper foil (4): Copper foil having a cobalt barrier layer "T9FZ-HS" (manufactured by FUKUDA METAL FOIL & POWDER CO., LTD., Rz: 6.0, Thickness 18 μm)

(Glass Substrate)

Glass substrate (1): #2116 type, WEA116E, "E glass" (manufactured by Nitto Boseki Co., Ltd., relative dielectric constant 6.8)

Glass substrate (2): #2116 type, NEA116, "NE glass" (manufactured by Nitto Boseki Co., Ltd., relative dielectric constant 4.8)

[Method for Preparing Resin Varnish]

First, components other than the initiator were added in the mixing ratio shown in Table 1 (mixing ratio in Table is indicated by part by mass) into toluene and mixed so that the solid concentration was 50 mass %. The resultant mixture was heated to 80° C. and stirred for 30 minutes while the temperature was kept at 80° C. Thereafter, the stirred mixture was cooled to 40° C., and then 1,3-bis(butylperoxyisopropyl)benzene (PERBUTYL P, manufactured by NOF CORPORATION) which is an initiator was added in the mixing ratio shown in Table 1 to give a resin composition in a varnish form (resin varnish) of each of examples and comparative examples.

Examples 1 to 4 and Comparative Examples 1 to 3

Next, a glass substrate shown in Table 1 was impregnated with each obtained resin varnish, and then dried by heating at 130° C. for about 3 minutes to 8 minutes to give a prepreg. In the procedure, the content of resin components such as polyphenylene ether, a thermosetting curing agent, and the like (resin content) was adjusted to be about 50 mass %.

Then six sheets of each obtained prepreg were stacked, and a copper foil shown in Table 1 was overlaid on both sides, and then the resultant stack was heated and pressurized at a temperature of 200° C. for 2 hours, under a pressure of 3 MPa, to give a metal-clad laminate for evaluation having a thickness of 0.8 mm.

Example 5

Using the resin varnish, a copper foil with resin (RCC) was prepared. The resin varnish was applied on a copper foil so that cured resin varnish gave a thicknesses of 130 µm, and dried by heating at 130° C. for 3 minutes until the resin varnish became a half-cured state, to give RCC.

Then, two sheets of RCCs obtained were overlaid, and then the resultant stack was heated and pressurized at a temperature of 200° C. for 2 hours, under a pressure of 3 MPa, to give a metal-clad laminate for evaluation having a thickness of 0.26 mm.

<Evaluation Test>

The laminate for evaluation prepared as described above was evaluated by methods described below.

[Dielectric Characteristics (Relative Dielectric Constant (Dk) and Dielectric Dissipation Factor (Df))]

A relative dielectric constant and a dielectric dissipation factor of each substrate for evaluation (copper-clad laminate obtained in the above) at 10 GHz were measured by the cavity resonator perturbation method. Specifically, the relative dielectric constant and the dielectric dissipation factor of the substrate for evaluation were measured at 10 GHz with use of a network analyzer (N5230A, manufactured by Keysight Technologies).

[Transmission Characteristics (15 GHz)]

First, a substrate for evaluating transmission characteristics was prepared in the following manner.

Regarding Examples 1 to 4 and Comparative Examples 1 to 3, a glass substrate (#1078 type, WEA116E, "E glass" (manufactured by Nitto Boseki Co., Ltd., relative dielectric constant 6.8) for Examples 1 to 3 and Comparative Examples 1 to 3; #1078 type, NEA116, "NE glass" (manufactured by Nitto Boseki Co., Ltd., relative dielectric constant 4.8) for Example 4) was impregnated with each resin varnish obtained in Examples 1 to 4 and Comparative Examples 1 to 3, and then dried by heating at 130° C. for about 3 minutes to 8 minutes to give a prepreg. In the procedure, the content of resin components such as the polyphenylene ether and the thermosetting curing agent (resin content) was adjusted to be about 60 mass %.

Then two sheets of each obtained prepreg were stacked, and a copper foil shown in Table 1 was overlaid on both sides, and then the resultant stack was heated and pressurized at a temperature of 200° C. for 2 hours, under a pressure of 3 MPa, to obtain a metal-clad laminate for evaluation having a thickness of 150 µm.

Next, either face of the double face laminate was processed at a line width ranging from 100 µm to 200 µm, inclusive, and then two sheets of prepreg were secondarily stacked to sandwich the processed face, to prepare a triple layer laminate. The line width was adjusted so that the characteristic impedance of the circuit after finishing was 50Ω.

Regarding Example 5, the resin varnish obtained in Example 5 was applied on a copper foil so that cured resin varnish gave a thicknesses of 150 µm, and dried by heating at 130° C. for 3 minutes until the resin varnish became a half-cured state, to give RCC.

Then the metal foil was disposed on the resin surface of the obtained RCC and molded, and a copper foil shown in Table 1 was overlaid on both sides, and then the resultant stack was heated and pressurized at a temperature of 200° C. for 2 hours, under a pressure of 3 MPa, to give a metal-clad laminate for evaluation having a thickness of 0.15 mm.

Next, either face of the double face laminate was processed at a line width ranging from 100 µm to 200 µm, inclusive, and then one sheet of RCC was disposed to sandwich the processed face, to prepare a triple layer laminate. The line width was adjusted so that the characteristic impedance of the circuit after finishing was 50Ω.

For each obtained triple layer laminate, passing loss was evaluated as transmission characteristics by using a network analyzer (N5230A, manufactured by Keysight Technologies). The evaluation frequency was 15 GHz.

[280° C. Oven Heat Resistance Test]

A test piece prepared according to JIS C6481 using the obtained copper foil-clad laminate was treated for 1 hour in a thermostatic bath equipped with an air circulator set at 280° C., and the sample in which all the five test pieces were not abnormal was determined as "Pass", and the sample in which "blistering" or "peeling" occurred in one or more of the five test pieces was determined as "NG".

[Moldability]

A double face laminate having a copper foil thickness of 70 µm was prepared as a substrate for evaluation, and one surface of the double face laminate was etched at four places with a 5 cm square to form a pattern. A prepreg or RCC prepared was attached to that surface and molded. When the etched place was completely filled, it was determined as "OK", and when there was an unfilled place, it was determined as "NG".

Test results are shown in Table 1.

TABLE 1

| Name of material | Name of manufacturer | Example 1 Mixing | Example 2 Mixing | Example 3 Mixing | Example 4 Mixing | Example 5 Mixing |
|---|---|---|---|---|---|---|
| (PPO terminal modified product) | | | | | | |
| PPE-1 (IV = 0.083 dl/g, functional group 1.9) | Self-made | | | | | |
| PPE-2 (IV = 0.125 dl/g, functional group 1.0) | Self-made | 70 | 70 | 70 | 70 | 70 |

TABLE 1-continued

| Name of material | Name of manufacturer | Example 1 Mixing | Example 2 Mixing | Example 3 Mixing | Example 4 Mixing | Example 5 Mixing |
|---|---|---|---|---|---|---|
| (Cross-linker) | | | | | | |
| TAIC 3 function | Nihon Kasei | 30 | | 30 | 30 | 30 |
| DCP 2 function | Shin Nakamura Chemical | | 30 | | | |
| (Peroxide) | | | | | | |
| PBP | NOF | 1 | 1 | 1 | 1 | 1 |
| (Filler) | | | | | | |
| SC2300-SVJ | Admatechs | 50 | 50 | 50 | 50 | 50 |
| (Copper foil) | | | | | | |
| T9FZ-SV Co treatment Rz 1.6 | FUKUDA METAL | ○ | ○ | | ○ | ○ |
| T4X-SV Ni treatment Rz 1.1 | FUKUDA METAL | | | | | |
| T9DA-SV Co treatment Rz 1.0 | FUKUDA METAL | | | ○ | | |
| T9FZ-HS Co treatment Rz 6.0 | FUKUDA METAL | | | | | |
| (Glass substrate) | | | | | | |
| E glass | Nitto Boseki | ○ | ○ | ○ | | |
| NE glass | Nitto Boseki | | | | ○ | |

| Items | | Example 1 Performance | Example 2 Performance | Example 3 Performance | Example 4 Performance | Example 5 Performance |
|---|---|---|---|---|---|---|
| Dielectric constant 10 GHz | | 3.6 | 3.6 | 3.6 | 3.2 | 2.8 |
| Dielectric dissipation factor 10 GHz | | 0.005 | 0.006 | 0.005 | 0.003 | 0.003 |
| Transmission characteristics 15 GHz | dB/m | −27 | −28 | −26 | −23 | −22 |
| Oven heat resistance 280° C. | | Pass | Pass | Pass | Pass | Pass |
| Moldability | | OK | OK | OK | OK | OK |

| Name of material | Name of manufacturer | Comparative Example 1 Mixing | Comparative Example 2 Mixing | Comparative Example 3 Mixing |
|---|---|---|---|---|
| (PPO terminal modified product) | | | | |
| PPE-1 (IV = 0.083 dl/g, functional group 1.9) | Self-made | | 70 | |
| PPE-2 (IV = 0.125 dl/g, functional group 1.0) | Self-made | 70 | | 70 |
| (Cross-linker) | | | | |
| TAIC 3 function | Nihon Kasei | 30 | 30 | 30 |
| DCP 2 function | Shin Nakamura Chemical | | | |
| (Peroxide) | | | | |
| PBP | NOF | 1 | 1 | 1 |
| (Filler) | | | | |
| SC2300-SVJ | Admatechs | 50 | 50 | 50 |
| (Copper foil) | | | | |
| T9FZ-SV Co treatment Rz 1.6 | FUKUDA METAL | | ○ | |
| T4X-SV Ni treatment Rz 1.1 | FUKUDA METAL | ○ | | |
| T9DA-SV Co treatment Rz 1.0 | FUKUDA METAL | | | |
| T9FZ-HS Co treatment Rz 6.0 | FUKUDA METAL | | | ○ |
| (Glass substrate) | | | | |
| E glass | Nitto Boseki | ○ | ○ | ○ |
| NE glass | Nitto Boseki | | | |

| Items | Comparative Example 1 Performance | Comparative Example 2 Performance | Comparative Example 3 Performance |
|---|---|---|---|
| Dielectric constant 10 GHz | 3.6 | 3.6 | 3.6 |
| Dielectric dissipation factor 10 GHz | 0.005 | 0.005 | 0.005 |

TABLE 1-continued

| | | | | |
|---|---|---|---|---|
| Transmission characteristics 15 GHz | dB/m | −29 | −27 | −34 |
| Oven heat resistance 280° C. | | Pass | Pass | Pass |
| Moldability | | OK | NG | OK |

As is apparent from the result of Table 1, it was confirmed that the metal-clad laminate and metal foil with resin of the present disclosure had excellent dielectric characteristics and heat resistance, and also had excellent resin fluidity and moldability as well as transmission characteristics. In particular, Example 4 using a glass substrate having a low dielectric constant showed very excellent dielectric characteristics and transmission characteristics.

In contrast to this, Comparative Example 1 using a metal foil having a barrier layer by the Ni treatment, and Comparative Example 3 in which the surface roughness of the metal foil was large were inferior in transmission characteristics. Comparative Example 2 in which the number of functional groups of the polyphenylene ether copolymer failed to satisfy the ranges of the present disclosure had lower resin fluidity and was inferior in moldability.

The invention claimed is:

1. A metal-clad laminate comprising:
an insulating layer including a cured product of a resin composition; and
a metal foil disposed on at least one principal surface of the insulating layer, wherein:
the resin composition includes a thermosetting curing agent and a polyphenylene ether copolymer, the polyphenylene ether copolymer having an intrinsic viscosity ranging from 0.03 dl/g to 0.14 dl/g, inclusive, and having, at a molecular terminal, a group represented by one of formula (1) and formula (2) at an average number of more than or equal to 0.8 and less than 1.5 per one molecule, the intrinsic viscosity being measured in methylene chloride at 25° C., and
the metal foil includes a barrier layer consisting of cobalt on a first surface of the metal foil, the first surface being in contact with the insulating layer and having a ten-point average roughness (Rz) of less than or equal to 2.0 µm:

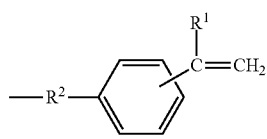

(1)

in formula (1), $R^1$ represents a hydrogen atom or an alkyl group having 1 to 10 carbon atoms, and $R^2$ represents an alkylene group having 1 to 10 carbon atoms:

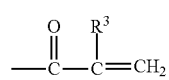

(2)

in formula (2), $R^3$ represents a hydrogen atom or an alkyl group having 1 to 10 carbon atoms.

2. The metal-clad laminate according to claim 1, wherein the group represented by formula (1) includes at least one selected from the group consisting of a p-ethenylbenzyl group and a m-ethenylbenzyl group.

3. The metal-clad laminate according to claim 1, wherein the insulating layer includes a glass substrate.

4. The metal-clad laminate according to claim 3, wherein:
the glass substrate has a relative dielectric constant of less than or equal to 5.0, and
the insulating layer has a relative dielectric constant of less than or equal to 4.0.

5. A printed wiring board comprising:
the metal-clad laminate according to claim 1; and
a conductor pattern as a circuit on a surface of the metal-clad laminate.

6. A metal foil with resin comprising:
an insulating layer including a half-cured product of a resin composition; and
a metal foil disposed on a principal surface of the insulating layer,
wherein:
the resin composition includes a thermosetting curing agent and a polyphenylene ether copolymer, the polyphenylene ether copolymer having an intrinsic viscosity ranging from 0.03 dl/g to 0.14 dl/g, inclusive, and having, at a molecular terminal, a group represented by one of formula (1) and formula (2) at an average number of more than or equal to 0.8 and less than 1.5 per one molecule, the intrinsic viscosity being measured in methylene chloride at 25° C., and
the metal foil includes a barrier layer consisting of cobalt on a first surface of the metal foil, the first surface being in contact with the insulating layer and having a ten-point average roughness (Rz) of less than or equal to 2.0 µm:

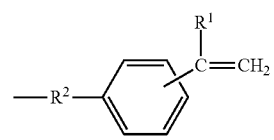

(1)

in formula (1), $R^1$ represents a hydrogen atom or an alkyl group having 1 to 10 carbon atoms, and $R^2$ represents an alkylene group having 1 to 10 carbon atoms:

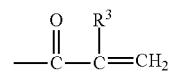

(2)

in formula (2), $R^3$ represents a hydrogen atom or an alkyl group having 1 to 10 carbon atoms.

7. The metal foil with resin according to claim 6, wherein the group represented by formula (1) includes at least one selected from the group consisting of a p-ethenylbenzyl group and a m-ethenylbenzyl group.

8. A printed wiring board comprising:
   the metal foil with resin according to claim 6; and
   a conductor pattern as a circuit on a surface of the metal foil with resin.

\* \* \* \* \*